US007404338B2

(12) United States Patent
Hierold et al.

(10) Patent No.: US 7,404,338 B2
(45) Date of Patent: Jul. 29, 2008

(54) FORCE SENSOR

(75) Inventors: Christofer Hierold, Hombrechtikon (CH); Alain Jungen, Zürich (CH); Christoph Stampfer, Völs am Schlern (IT)

(73) Assignee: ETH Zurich, Zurich (CH)

( * ) Notice: Subject to any disclaimer, the term of this patent is extended or adjusted under 35 U.S.C. 154(b) by 0 days.

(21) Appl. No.: 10/591,879

(22) PCT Filed: Dec. 22, 2004

(86) PCT No.: PCT/EP2004/014570

§ 371 (c)(1),
(2), (4) Date: Sep. 5, 2006

(87) PCT Pub. No.: WO2005/095997

PCT Pub. Date: Oct. 13, 2005

(65) Prior Publication Data

US 2007/0186665 A1 Aug. 16, 2007

(30) Foreign Application Priority Data

Mar. 2, 2004 (EP) ................................. 04004883

(51) Int. Cl.
*G01L 1/04* (2006.01)
*G01P 15/08* (2006.01)

(52) U.S. Cl. ............................. 73/862.68; 73/862.625; 73/862.636; 73/862.622; 73/514.35; 977/724; 977/953; 977/956

(58) Field of Classification Search ................. 977/724, 977/732, 733, 932, 953, 956; 73/774, 763, 73/855, 856, 860, 862.471, 862.451, 862.391, 73/862.381, 862.473, 862.621–862.623, 73/862.625, 862.636–862.641, 862.68, 514.01, 73/514.16, 514.25, 514.35, 514.38
See application file for complete search history.

(56) References Cited

U.S. PATENT DOCUMENTS

2002/0167374 A1 11/2002 Hunt et al.

OTHER PUBLICATIONS

J. Chung, J. Lee. "Nanoscale gap fabrication and integration of carbon nanotubes by micromachining." Sensors and Actuators A. 104 (2003) pp. 229-235.*

A. Husain, J. Hone, Henk W. Ch. Postma, X. M. Huang, T. Drake, M. Barbic, A. Scherer, and M.L. Roukes. "Nanowire-based very-high-frequency electromechanical resonator." Applied Physics Letters. V. 83, No. 6 (2003) pp. 1240-1242.*

Minot et al. (E.D. Minot, Y. Yuaish, V. Sazonova, J-Y. Park, M. Brink, P. L. McEuen. "Tuning Carbon Nanotube Band Gaps with Strain." Phys. Rev. Lett. 90 156401 (2003) pp. 1-4).*

Tombler et al.: "Reversible electromechanical characteristics of carbon nanotubes under local-probe manipulation", Nature, Jun. 15, 2000.

Husain et al.: "Nanowire-based very-high-frequency electromechanical resonator", Applied Physics letters, Aug. 11, 2003.

Toriyama Toshiyuki et al.: "Piezoresistance measurement on single crystal silicon nanowires", Journal of Applied Physics, Jan. 1, 2003.

* cited by examiner

*Primary Examiner*—Edward Lefkowitz
*Assistant Examiner*—Punam Patel
(74) *Attorney, Agent, or Firm*—Laurence A. Greenberg; Werner H. Stemer; Ralph E. Locher

(57) ABSTRACT

The resolution and the signal-to-noise ration of known force sensors as e.g. capacitive force sensors decrease when scaling them down. To solve this problem there is a solution presented by the usage of a nanostructure as e.g. a carbon nanotube, which is mechanically deformed by a force to be measured. The proposed force sensors comprises a support with two arms carrying the carbon nanotube. The main advantage of this nanoscale force sensor is a very high sensitivity as the conductance of carbon nanotubes changes several orders of magnitude when a mechanical deformation arises.

7 Claims, 2 Drawing Sheets

FORCE SENSOR

BACKGROUND OF THE INVENTION

Field of the Invention

This invention relates to a force sensor according to the preamble of claim 1.

The present invention covers the field of measuring a force with a system in the micro- or nano-regime. Micro electromechanical force sensors are available in a plurality of principles. They differ by the detection mechanisms. Known sensors are based on piezoresistive, capacitive, tunnel current or thermal principles. These know force sensors are relatively large, that is they have large dimensions as some multiples of 100 μm. Force sensors according to the state-of-the-art are disclosed in the documents [5] and [6], in which limits to its size that is limits to a further miniaturization can be derived. In the context of the present invention force sensors are also denoted by <<inertial sensors>>.

In paper [1] furthermore all the problems which arise due to the increasing miniaturization of force sensors are discussed. The principle of a capacitive force sensor is depicted in FIG. 4(*a*): Due to the influence of a force $$F=m\cdot a,$$

where m denotes the mass and a the effecting acceleration, a change Δx of the distance $x_0$ of two electrodes or plates A will occur. The capacity C is also determined by the dielectric constant $\in_0$ as well as by number $\in_r$, which is determined by the dielectric material between the plates A. These capacitive sensors show in general a degradation of the resolution by miniaturization. This effect results one the one hand from a not very suitable signal to noise ratio (SNR). On the other hand the actual cause is an over proportional scaling down of the forces as well as restrictions due to process limitations and design rules. They are also called miniaturization barriers. The limitations prevent that the scaling down of forces can be compensated by a corresponding miniaturization of the distance $x_0$ of the electrodes.

A numeric example explains the draw back of the state-of-the-art sensor according to FIG. 4(*a*):

$x_0$=1 μm;
Δx=0.05 μm;
$C_0$=0.53 pF;
$A=6\cdot10^4$ μm$^2$.

The displacement of the plates by Δx=0.05 μm results in a relative change of capacitance $\Delta C_{rel}\approx 5\%$.

Furthermore the increasing miniaturization of force sensors leads to the problem of a reduction of the gauge factor for measuring a force. For a capacitive force sensor a limit arises also in reduction of its seismic mass due to design rules.

The present invention therefore addresses the problem due to the miniaturization of force sensors.

SUMMARY OF THE INVENTION

The object of the present invention is to overcome the problems presented by the prior force sensors, especially to the degradation of the resolution.

These problems resulting from a further miniaturization are solved by a force sensor specified in claim 1.

By the proposed use of a nanostructure as e.g. a carbon nanotube a force sensor is provided, which increases significantly the sensitivity as well as the resolution. This improvements result from on the sensing principle based on quantum-mechanical effects. By a deformation of a nanostructure its electrical conductance is affected up to two orders of magnitude. This outstanding sensitivity of a nanostructure as e.g. a carbon nanotube is disclosed in [2].

Further advantageous embodiments are given in dependant claims.

BRIEF DESCRIPTION OF THE DRAWINGS

The invention will be now described in preferred embodiments with reference to the accompanying drawings wherein:

FIG. 4(*b*) discloses the principle of a force sensor according to the present invention;

DESCRIPTION OF THE PREFERRED EMBODIMENTS

Figure 5:
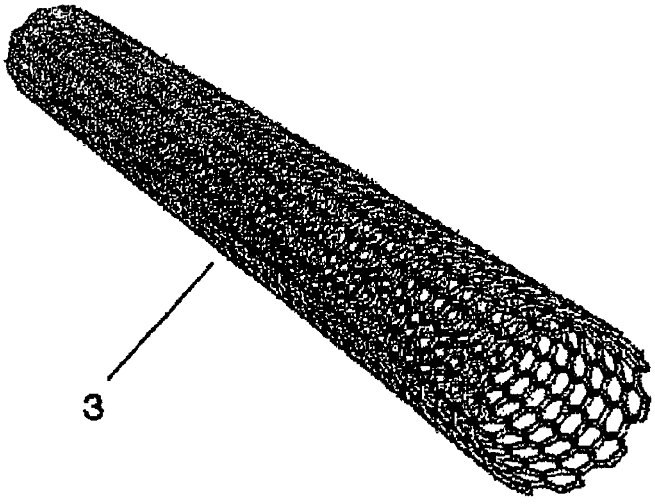
FIG. 5 shows a carbon nanotube.

FIG. 5 illustrates the topological structure of a carbon nanotube. The aspect ratio of common carbon nanotubes is in the range 50 . . . 5000. An example of the length is given below. Before explaining embodiments the properties of carbon nanotubes are first briefly discussed and references to its properties and production are given.

The invention becomes apparent by considering the sensitivity of a carbon nanotube when being object of a deformation caused by a force F. Sensitivity is in this context the ratio $$\Delta G/\Delta F$$

where ΔG: change of conductance.

ΔF: change of force.

For a carbon nanotube 3 the conductance G instead of the capacitance C is the electrical property, which is affected by the resulting deformation caused by a force. The sensitivity of a carbon nanotube 3 is up to two orders of magnitude compared to the sensitivity of a capacitive force sensor. This outstanding sensitivity and its possible causes are discussed and disclosed in the document [2].

Corresponding to the values given in the introduction of this document the sensitivity of a force sensor 1 with a carbon nanotube of height h is approximately as follows:

h=0.600 μm;
Δx=0.050 μm;
F=8 nN;
$\Delta G_{rel}$=99%.

In the publication [3] in an extensive manner the synthesis, properties and possible applications of carbon nanotubes 3 are disclosed. The teachings of this document [3] are therefore here incorporated by reference to it.

Figure 3A:
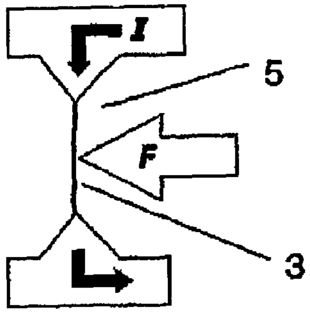
FIG. 3(*a*), FIG. 3(*b*) show the principle of the deformation of a carbon nanotube.
Figure 3B:
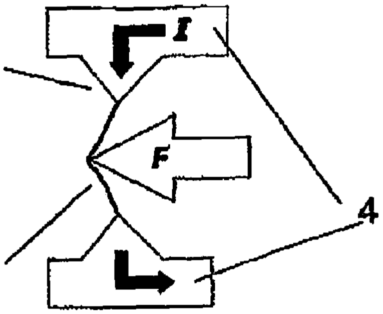
Figure 4A:
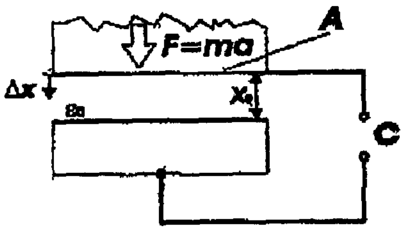
FIG. 4(*a*) shows the principle of a known capacitive force sensor.
Figure 4B:
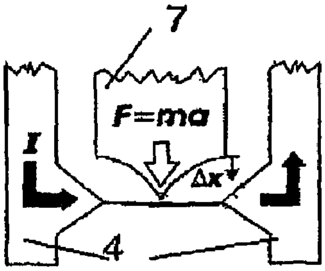

The principle of a force sensor 1 according the present invention is depicted in FIGS. 3(*a*), 3(*b*) and 4(*b*). According to the representation in FIGS. 3(*a*) and 3(*b*) a force F acts on carbon nanotube 5. A carbon nanotube 5 is carried or fixed between two arms 4. The carbon nanotube 5 itself is part of a electric circuit with a current I. A deformation Δx caused by a force F perpendicular to the carbon nanotube 3 decreases its conductance G. This results by a voltage driven measurement in a lowering of current I. The amount of the current I gives an indirect measure of the acting force F. By an external circuitry and an appropriate calibration the size of the force F can be displayed. The force F is either from an external source or caused by an movable element, which is a part of the force sensor 1. The latter principle is depicted in FIG. 4(*b*), where the movement of the element 7 is caused by an acceleration.

In table 1 shows an example of the dimensions and its parameters of a carbon nanotube, which is the basic element of the present invention. The cited values correspond to those disclosed in [2], the symbol S denotes the unit Siemens, the unit for conductance G:

TABLE 1 typical parameters of a carbon nanotube.

| Dimension, parameter | Value |
|---|---|
| Length of a carbon nanotube | 500 nm |
| force acting perpendicular to the axis of a carbon nanotube | 8 nN |
| displacement, deformation $\Delta x$ | 50 nm |
| conductance change $\Delta G$ | $9 \cdot 10^{-6}$ S to $9 \cdot 10^{-8}$ S |

For a force sensor 1 according to the present invention the carbon nanotube 3 may built on the basis of a chemical vapour deposition process CVD as controlled growth on prepatterned nanostructures. Details to this processes can be derived from document [4].

Figure 1:
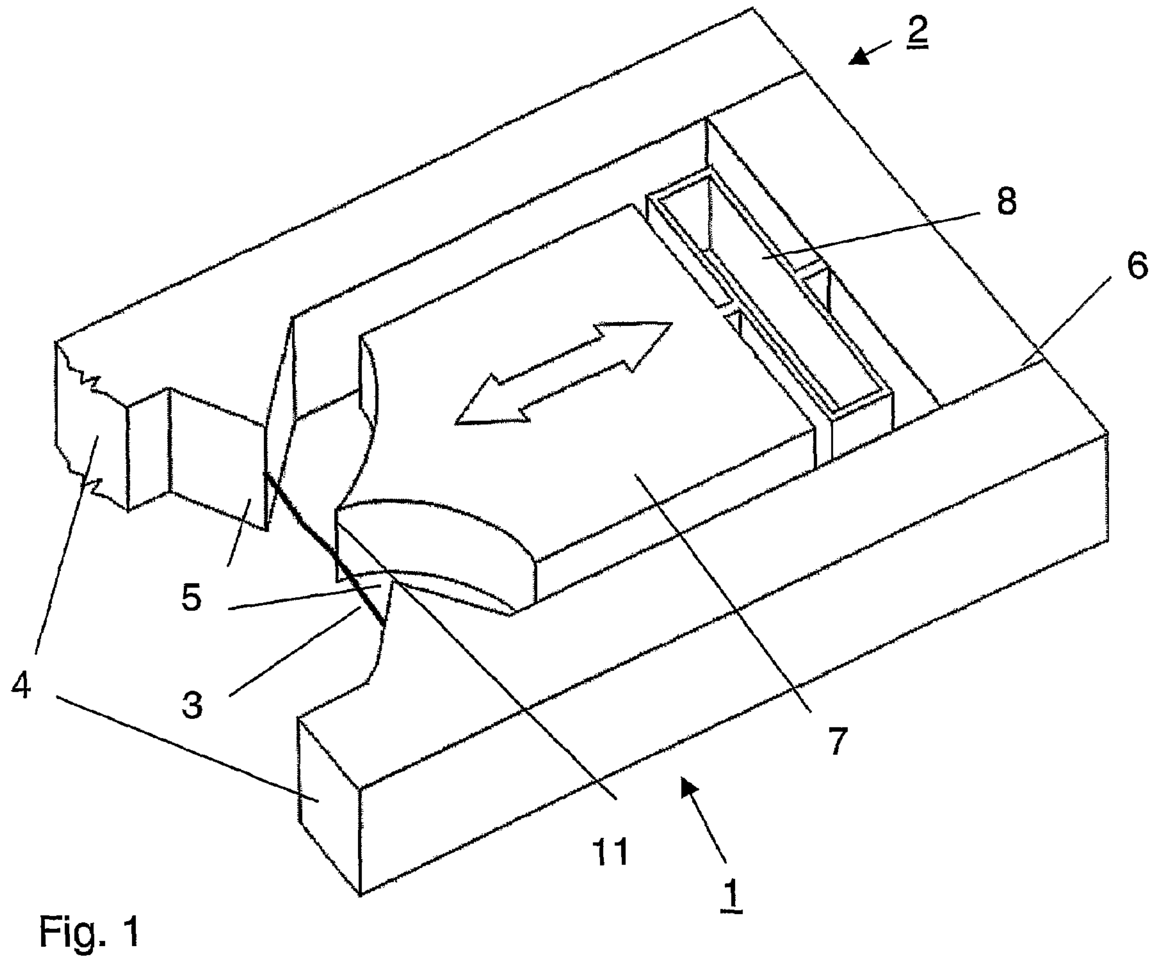
FIG. 1 is a view of a first embodiment.

FIG. 1 shows a g-sensor 1—acceleration sensor—as a first embodiment of the present invention. The sensor 1 includes a U-shaped support 2 of two arms 4 carrying carbon nanotube 3. The two arms 4 are electrically insulated at the position 6, partly shown in FIG. 1. A moveable element 7 of mass m is located between the arms 4. The moveable element 7 is provided with a cusp tip 11. A movement of the element 7 towards the carbon nanotube 3 is caused by a force F determined by $$F=m\cdot a,$$

where:
m mass of element 7;
a acceleration acting via sensor 1 on element 7.

Tip 11 transfers the force F on to the carbon nanotube 3, by which force the carbon nanotube is mechanically stressed, that is deformed by a value $\Delta x$.

Optionally (not shown in FIG. 1) the sensor 1 is provided with at least one stop element in order to limit the movement of element 7. These stop elements enable a improved shock resistance of the sensor 1. Each arm 4 is provided with a cusp 5, on which the carbon nanotube 3 is mounted.

The stability of the moveable element 7 may be increased by at least one spring 8. The spring 8 serves also for the guidance of the moveable element 7

Figure 2:
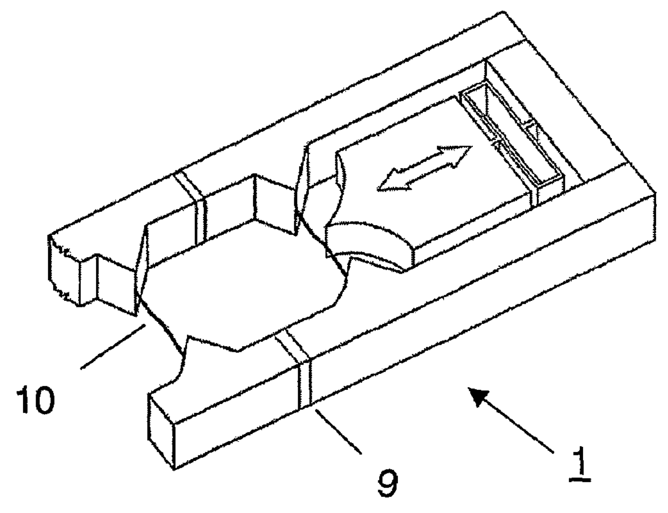
FIG. 2 is a view of a first embodiment, which allows a compensation of environmental effects.

A further embodiment of the present invention is depicted in FIG. 2 with a second nanotube 10. The second carbon nanotube 10 may not be deformed by a force F. The arrangement with a second nanotube 10 allows the compensation of environmental effects as e.g. temperature. The second carbon nanotube is in mounted to the arms 4 in the same manner as described above. However the second carbon nanotube 10 is electrically insulated from the first one. The second carbon nanotube 10 is also part of an electric circuit with a current I. By an external circuitry this arrangement allows a common mode rejection, that is the above mentioned compensation of environmental effects. Also a possible deformation of the support 2 can be compensated by using a second carbon nanotube 10

Force sensors and g-sensors according to the present invention are especially suitable for Vehicle dynamic control systems, but this example of application is not limiting at all.

The outstanding sensitivity of a g-sensor 1 according to the present invention allows the detection of very small accelerations, which opens a broad field of applications.

The invention is not limited to the embodiment depicted above with a carbon nanotube. The invention can also be carried out with other elements which have similar properties as carbon nanotube. Another example is a bor-nitride nanotube. It shows a huge change in electrical and optical properties by mechanical deformation as it has been shown for carbon nanotubes

[1]. In a more general context nanotubes count to the material class of quasi one-dimensional (1D) nanostructures which are characterized by the confinement of electrons in two spatial directions. These strong effects even hold for a big class of nanostructures where local atomic bonds determine the electrical and optical properties.

Therefore in this paper the elements
carbon nanotubes,
nanotubes,
quasi one-dimensional (1D) nanostructures are summarized by the general term <<nanostructure>>.

LIST OF REFERENCE NUMERALS

1 force sensor, inertial sensor
2 support
3 carbon nanotube, nanotube, bor-nitride nanotubes, quasi one-dimensional (1D) nanostructures; nanostructure
4 arm
5 cusp at the arm 4, mounting point of a carbon nanotube
6 insulation
7 moveable element, mass
8 spring
9 insulation between nanotube 3 and 10
10 second carbon nanotube, second nanotube, second bor-nitride nanotubes, second quasi one-dimensional (1D) nanostructures; second nanostructure
11 tip of the moveable element 7

LIST OF SYMBOLS a acceleration [$m/s^2$]
$\epsilon_0$ dielectric constant
$\epsilon_r$ relative dielectric constant
F force
G conductance
m mass [g]
$x_0$ distance, e.g. [μm or nm]
$\Delta x$ displacement, e.g. [μm or nm]
$\Delta C$ change of capacity.
$\Delta F$ change of force.
$\Delta G$ change of conductance

LIST OF ACRONYMS

CNT carbon nanotube
CVD chemical vapour deposition
MEMS Microelectromechanical systems
SNR Signal to noise ratio
VDC Vehicle dynamic control

REFERENCES

[1] C. Hierold,
<<Micro- and Nanosystems: Review and Outlook>>,
MME 2003, $14^{th}$ Micromechanics Europe Workshop, Delft, 2003.
[2] S T. W. Tombler et al.,
<<Reversible electromechanical characteristics of carbon nanotubes under loca-probe manipulation>>
Nature 405, 769 (2000)

[3] S. B. Sinnott and R. Andrews,
<<Carbon Nantubes: Synthesis, properties and applications>>
Critical Reviews in Solid State and Material Science, 26 (3), 145 (2001)

[4] N. R. Franklin and H. Dai,
<<An enhanced CVD approach to extensive nanotube networks with directionality>>
Advanced Materials, 12, 890, (2000)

[5] C. Acar and A. M. Shkel,
<<Experimental evaluation and comparative analysis of commercial variable-capacitance MEMS accelerometers>>
Journal of Micromechanics and Microengineering 13 634 (2003)

[6] N. Yazdi, F. Ayazi, K. Najafi,
<<Micromachined Inertial Sensors>>
Proceeding of the IEEE, Vol. 86, No. 8, August 1998

We claim:

1. A force sensor device, comprising:

a support of two arms carrying a longitudinal electromechanical element in form of a nanostructure, said nanostructure having an electrical property changeable in response to a mechanical deformation due to a force, said nanostructure defined as a first nanostructure;

a moveable element disposed to transmit a force to said nanostructure; and a second nanostructure carried by said arms for compensating for environmental effects.

2. The force sensor device according to claim 1, wherein each of said two arms is formed with a cusp carrying said first nanostructure and with a cusp carrying said second nanostructure.

3. The force sensor device according to claim 1, which further comprises an insulation formed on at least one of said arms for electrically separating said nanostructures.

4. The force sensor device according to claim 1, wherein said second nanostructure is a nanotube, a carbon nanotube, or a quasi one-dimensional nanostructure.

5. The force sensor device according to claim 1, wherein said first nanostructure is a structure selected from the group consisting of a nanotube, a carbon nanotube, a boron-nitride nanotube be, and a quasi one-dimensional nanostructure.

6. The force sensor device according to claim 1, wherein the electrical property is a conductivity of said nanostructure.

7. The force sensor device according to claim 1, wherein said support is a U-shaped support.

* * * * *